United States Patent [19]

Biechler et al.

[11] Patent Number: 4,498,010
[45] Date of Patent: Feb. 5, 1985

[54] VIRTUAL ADDRESSING FOR E-BEAM LITHOGRAPHY

[75] Inventors: Charles S. Biechler, Hayward; Allen M. Carroll, Berkeley; Richard E. Graves, Fremont; Steven A. Lyons, Oakland, all of Calif.

[73] Assignee: The Perkin-Elmer Corporation, Norwalk, Conn.

[21] Appl. No.: 491,678

[22] Filed: May 5, 1983

[51] Int. Cl.³ .................... H01J 37/302; H01J 37/317
[52] U.S. Cl. ................................................. 250/492.2
[58] Field of Search ..................................... 250/492.2

[56] References Cited
U.S. PATENT DOCUMENTS
4,445,039 4/1984 Yew ................................. 250/492.2
4,463,265 7/1984 Owen et al. ...................... 250/492.2

Primary Examiner—Alfred E. Smith
Assistant Examiner—Jack I. Berman
Attorney, Agent, or Firm—Randall G. Wick; Thomas P. Murphy; Edwin T. Grimes

[57] ABSTRACT

A technique performed in a fixed address particle beam lithographic system where the writing is performed in the normal manner for writing a pattern, for example, a stripe on a resist having a selected feature width except that an additional row of alternate pixels is written either before or after the selected feature is written. The alternate pixels, when the resist is developed, will provide a feature width of approximately ½ a pixel wider than the selected feature width due to blurring of the latent image caused by scattering of the particle beam within the resist. Thus, the resolution of selectable feature widths is enhanced with little or no loss of throughput. The same technique can also be utilized to lengthen a feature by ½ a pixel width. The technique is disclosed primarily in a raster scan machine but also disclosed is the technique in a vector scan machine. Also disclosed is a flow chart showing the invention used while preparing the data to be written by the machine.

11 Claims, 8 Drawing Figures

VIRTUAL ADDRESSING FOR E-BEAM LITHOGRAPHY

BACKGROUND OF THE INVENTION

1. Field of the Invention

This invention relates to particle beam systems used in the manufacture of microminiature devices (integrated circuits) and is particularly directed to a new and improved writing technique (process) for a particle beam lithography system and the primary object of this invention is to provide a means of changing the dimension of lines written by existing lithographic systems without major software changes in such systems.

2. Prior Art

Lithographic systems using a controllable electron beam, sometimes called E-beam machines, for the fabrication of integrated circuits are old in the art; one such system is described at length in the U.S. Pat. No. 3,900,737 to Collier et al. and another in the U.S. Pat. 3,801,792 to Lin.

In these patented machines, a medium of resist material upon which the electron beam is to perform its writing operation is positioned on a motor driven stage which is moved continuously and in synchronism as the beam is scanned in a raster fashion in a direction perpendicular to the stage motion. In practice, the diameter of the round electron beam spot, also called a "gaussian spot" or "pixel", focused on the resist layer, is also the "address" dimension of the system. Typically, at least four rows of addresses (pixels) in the stage travel direction define the width of a "feature" and the length of the feature is formed by a number of pixels in the raster scan direction. The pattern on the resist defined by the beam and by the stage movement is determined by the system control equipment and software therefor.

In some cases, it has been found to be desirable to write a line with a change in feature width or length by an amount which is not an integral multiple of the selected pixel size. Suppose, for example, one wanted to write a feature of a width equal to 4½ pixel diameters. The prior art would require a reduction in pixel size and an increase in the number of raster scans. The pixel size would be reduced by ½ in order to change the feature width by one-half a pixel. The number of scans in the feature direction must then be increased. Using the smaller pixel size would require 9 scans to produce the desired feature width (eight scans to obtain the width equal to four rows of the larger pixel plus one scan for the desired ½ pixel increase in feature width). This example of decreased pixel size can be stated another way, i.e. the throughput of a raster scan E-beam lithographic system is inversely proportional to the square of the pixel size. It can be appreciated that the lesser pixel size to provide the wider line width in the feature direction is undesirable since it reduces the throughput of the machine dramatically. It should be clear also that to increase the feature length by less than one width of a large pixel would present the same problem as the above described increase in feature width. This invention shows that the feature width or length can be changed by less than 1 pixel diameter without changing the pixel size, thus keeping the throughput of the machine unchanged.

SUMMARY OF THE INVENTION

The writing technique comprising this invention is performed in a particle beam lithographic system having, inter alia, a particle beam source, a particle beam, means of beam blanking and means for focusing said beam onto a resist-coated substrate positioned on a movable stage. The writing is performed in the normal manner for raster scan writing having a selected feature width with additional pixels written either before or after the selected feature is written but where the beam is blanked and unblanked in alternating spot positions. When processed, the feature will have a width approximately ½ a pixel wider than the selected feature width.

It will be apparent to those skilled in the art that this writing technique takes advantage of a phenomenon considered a nuisance in the prior art, namely, scattering of the beam particles in the resist and consequent blurring of the latent image.

DETAILED DESCRIPTION

Figure 1:
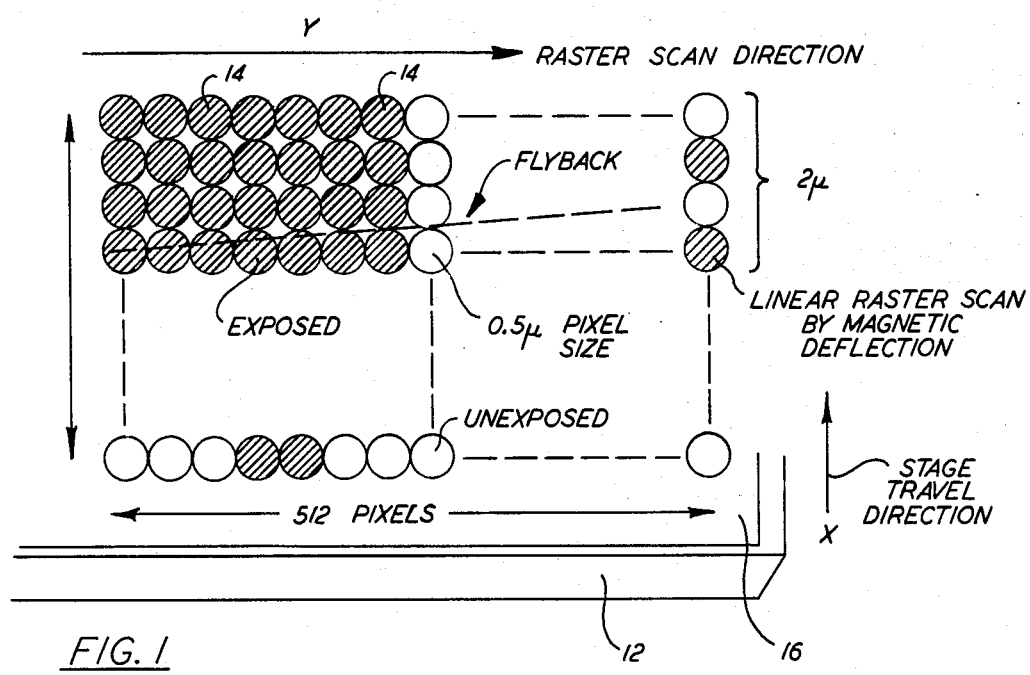
FIG. 1 illustrates a prior art writing technique.

FIG. 1 illustrates a writing operation by an E-beam machine similar to the writing operation taught in the Collier et al patent. As shown in this figure, the arrow "X" represents the movement of the stage 12 and the arrow "Y" represents the movement of the electron beam in a raster scan fashion. In this system, an address or pixel is defined as the diameter of the beam spot on the medium. As illustrated, circles 14 represent beam spots or pixels on a resist 16 (resist coated substrate) and to illustrate the effect of the modulation (or blanking) of the beam, certain of the pixels are shown blank (unexposed) while others are shown solid (exposed). Modulation or blanking of the beam in the Collier et al. apparatus occurred at 10 MHz with 4 rows of pixels defining a 2.0 micrometer feature width and 512 pixels defining a 128 micrometer length utilizing a pixel size of 0.5 micrometers.

Figure 2:
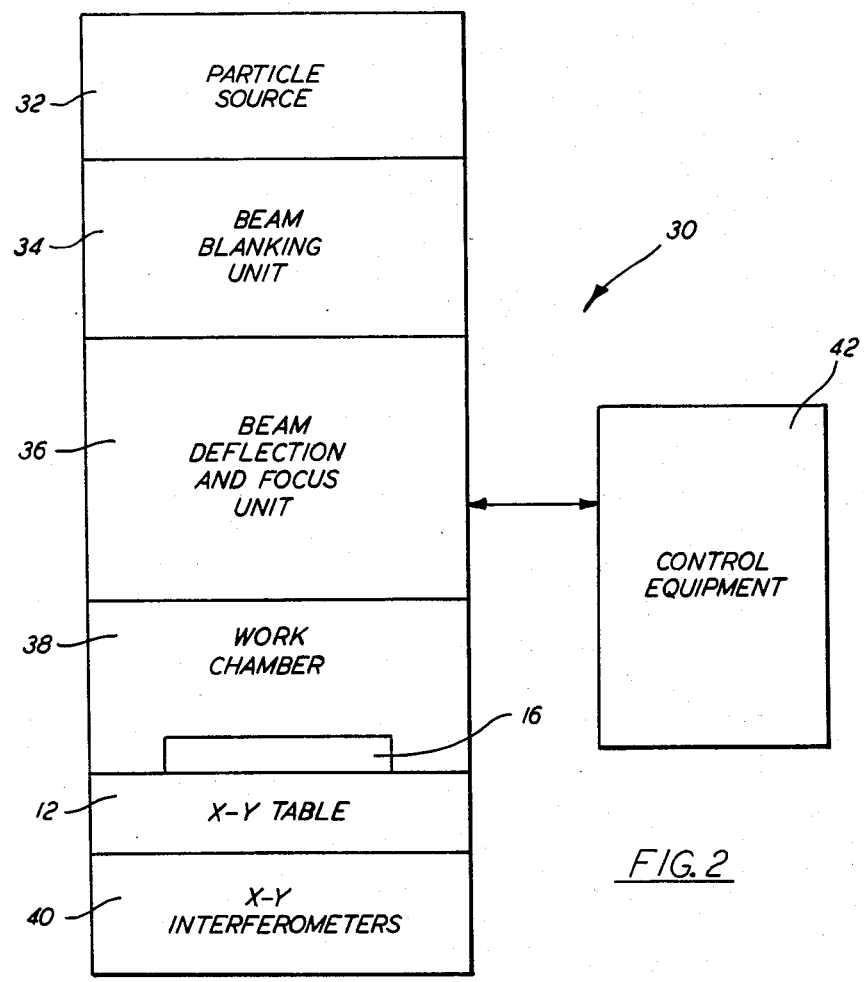
FIG. 2 illustrates a system for writing using the prior art writing technique.

FIG. 2 illustrates a particle beam lithographic system 30 utilizable for accomplishing the above writing technique which comprises a particle or electron source 32, a beam modulating or blanking unit 34 for providing the modulation of the beam, a beam deflection and focus unit 36, a work chamber 38 containing the stage 12 with resist 16 and a means for determining the registration of the beam at the proper coordinates, all under the control of control equipment 42. The system disclosed is similar to the prior art systems of the Collier et al and Lin patents and performs the technique as part of this invention in a similar manner.

Figure 3:
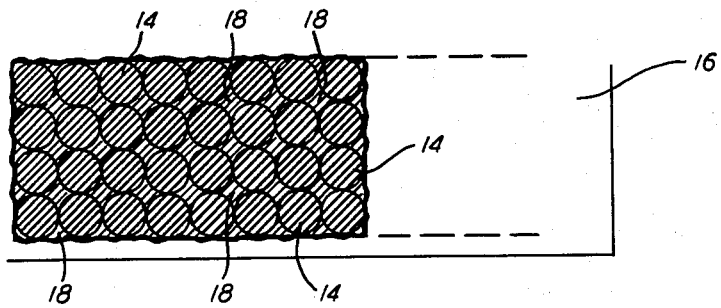
FIG. 3 illustrates the effect of the development of the resist after writing.

When the desired writing on the resist is complete, the resist is processed by conventional lithographic development techniques resulting in features as defined by the pixels during writing. The cross hatched area 18 in FIG. 3 indicates the feature of the developed resist. The areas actually exposed by the incident electron beams are shown in double cross hatching 14. The difference between what was exposed by the electron beam and what was finally developed can be attributed to a phenomena known as scattering of electrons.

Figure 4:
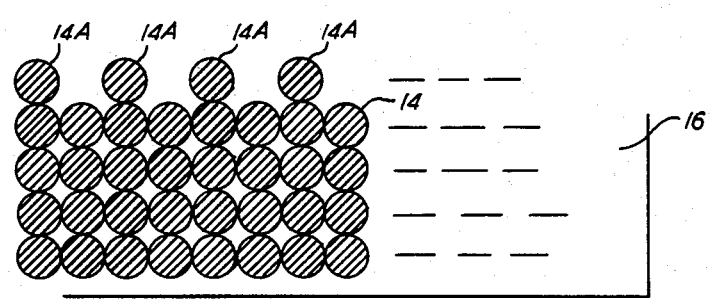
FIG. 4 illustrates the writing technique of this invention.

Turning now to FIG. 4, there is shown a resist 16 with pixels 14 as written by an E-Beam machine. However, before the feature is actually written, that is, before the scan lines of spots 14 are formed to define the normal 2.0 micrometer feature width, as described in connection with FIG. 1, a first row of pixels 14A are formed by modulating the beam. When complete, the alternate pixels 14A will be located immediately adjacent to the exposed resist spots 14 as represented by the hatched line spots. The line pattern is, of course, known to the operator beforehand. This alternate exposed and unexposed pattern occurs for the full feature length, and thereafter the feature width is defined as in the prior art.

Figure 5:
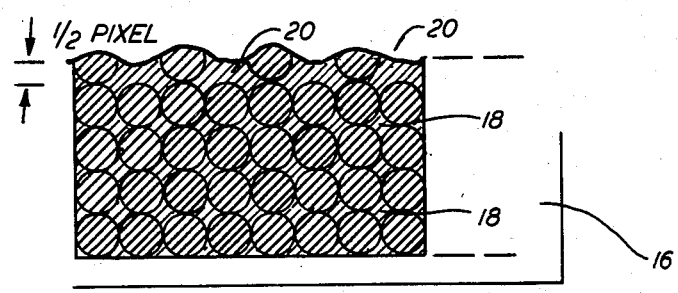
FIG. 5 illustrates the increase of the width of the line written by the beam after development of the resist.

Turning now to FIG. 5, there is shown the resist after developing. It can be seen that, after developing, the areas or valleys 20 between the alternate pixels 14A are filled as at 20. The pixels themselves blend into the valleys 20 formed between alternate exposed pixels and the areas 18 between the other pixels 14 fill in as described above in connection with FIG. 3.

As can be seen from the developed resist, the feature width has been widened by approximately ½ a pixel width without any loss of throughput of the machine utilizing the phenomena of backscattering of the electrons (commonly known as proximity effects).

While the above has been described in connection with the use of alternate exposed pixels at the beginning of the writing, obviously, the alternate pixels such as 14A could be performed after the feature width has been defined by the four rows in the embodiment illustrated, the sole difference being in the movement of the center line of the written line from the upward position, as viewed in the drawings at FIG. 5, to a downward position.

Figure 6:
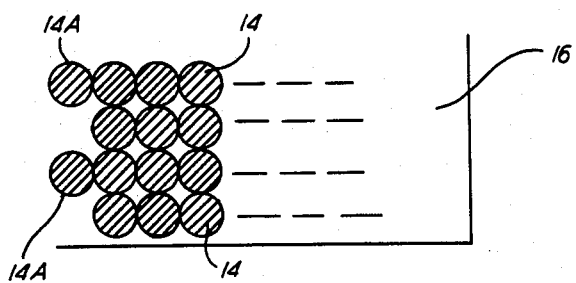
FIG. 6 illustrates the lengthening of a feature by the writing technique of this invention.

It should be obvious to those skilled in the art that the concept of using alternate exposed pixels 14A can be used to lengthen a line by providing alternate exposed pixels 14A either before or after the feature length has been defined. An example of utilizing this process before the feature is written is illustrated in FIG. 6.

Figure 7:
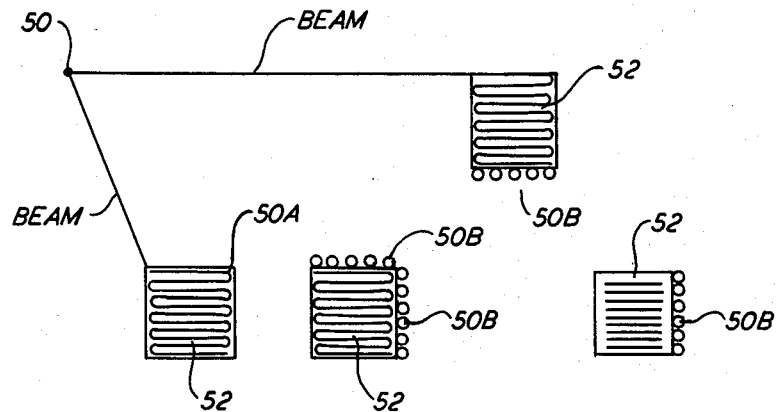
FIG. 7 illustrates the writing technique of this invention in a vector scan system.

While all of the foregoing has been directed to raster scan techniques, FIG. 7 shows a simplified illustration of the use of this invention in a vector scan system.

Conventionally, in vector scan systems, the beam is directed to a selected point, such as 50, on the resist where the beam is then caused to scan to define a feature 52 of a predetermined size. Thereafter, the unmodulated beam is then directed to another point, such as 50A, where the process is repeated until the desired pattern is written on the resist. If the pattern design requires a slightly larger feature at one or more sites, the same technique, as described above, can be used to alternately form exposed and nonexposed spots 50B (alternate pixels) along any one side, or adjacent pairs of sides of the feature, to thus expand it by ½ a pixel width after the resist has been developed.

Figure 8:
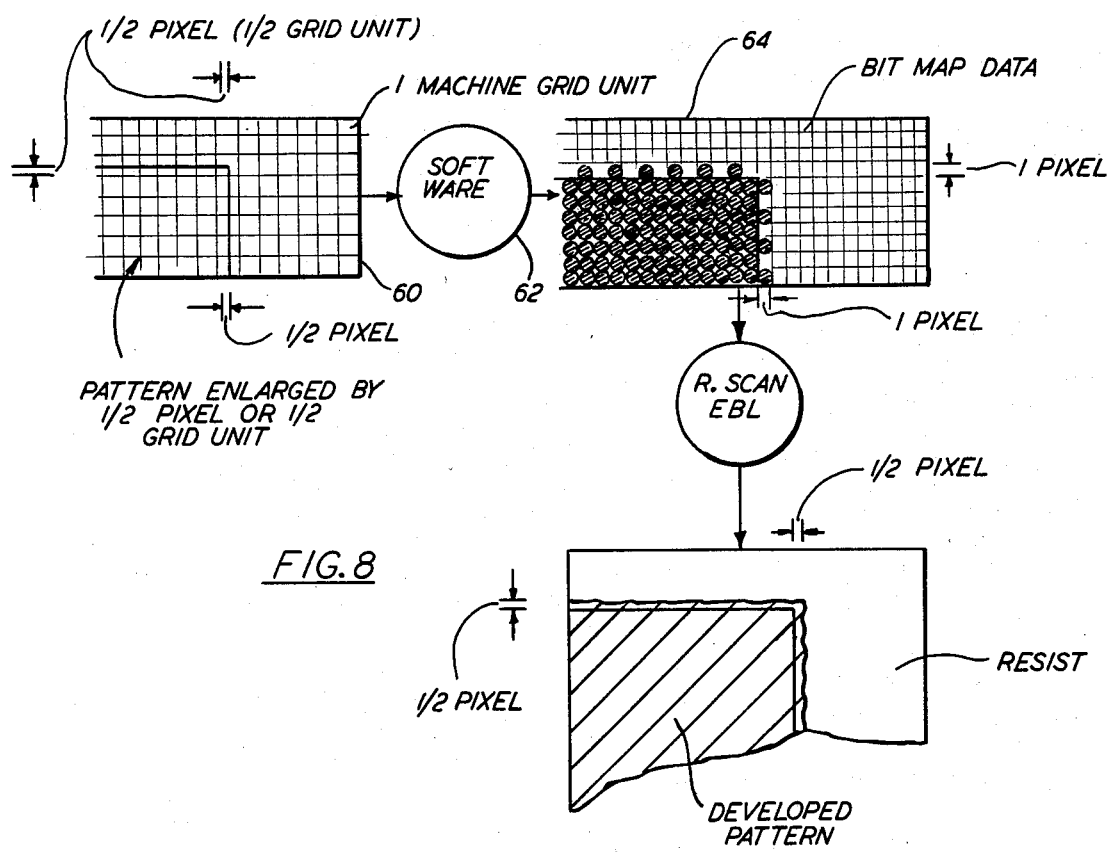
FIG. 8 is a flow chart showing the invention used during the pattern data preparation.

FIG. 8 illustrates a flow chart of the process by which the invention is preferably practiced. A CAD (Computer Assist Design) designated as 60 holds the data to be written which is modified by software at 62 resulting in the bit map data held in, for example, shift registers 64 and the bid data is transfered out, either in parallel or in series, and the resist is transformed into a wider or longer feature depending upon what the designer requires.

From the foregoing, it can be seen that the invention gives the operator of a system with any kind of writing strategy, but with a fixed address system the ability to enlarge pattern areas at the time of preparing data to be written, through the use of a known phenomena heretofore considered a negative aspect of particle beam technology.

What is claimed is:

1. In the fabrication of integrated circuits in a particle beam apparatus, the steps in the process comprising,
    forming a particle beam of the desired diameter thus defining the width of a pixel,
    providing a resist material to be irradiated by said beam on a substrate,
    forming pixels by directing said beam onto said resist material,
    controlling said beam as it forms said pixels to form a plurality of adjacent lines of pixels which lines define a feature of a predetermined length and width,
    controlling said beam as it forms said area to form pixels adjacent said feature to change said feature by approximately ½ a pixel width when said resist material is developed, and finally,
    developing said resist material.

2. The process as claimed in claim 1 wherein said beam is further controlled to form gaps between said pixels which form said lines, and further controlling said beam so that said pixels which change said features are adjacent said pixels which form said feature.

3. The process as claimed in claim 1 wherein the control of said beam to form the pixels which change the feature is such that the pixels and gaps alternate in a line adjacent said lines which form said feature.

4. The process as claimed in claim 1 wherein scanning said resist is scanned in one direction by said beam, and
    wherein said resist material and substrate are moved in a direction at right angles to the scanning direction of said beam,
    the movement of said resist material and substrate in a direction at right angles to said beam scanning direction is synchronized with the movement of said beam.

5. In the fabrication of integrated circuits in a particle beam apparatus, the steps in the process comprising,
    forming a particle beam of the desired diameter thus defining a pixel,
    providing a workpiece to be irradiated by said beam on a support with said beam forming pixels on said workpiece,
    scanning said workpiece in one direction by said beam,
    moving said workpiece in a direction at right angles to the scanning direction of said beam,
    the movement of said workpiece in a direction at right angles to said beam scanning direction being synchronized with the movement of said beam,
    blanking and unblanking said beam as it scans said workpiece to form lines of pixels and gaps therebetween to define features on said workpiece,
    blanking said beam adjacent said features to change said features by approximately ½ a pixel width when said workpiece is finally processed, and finally,
    processing said workpiece.

6. The process as claimed in claim 1 wherein the blanking of said beam adjacent said features is done alternately to provide a row of alternate pixels adjacent said features.

7. The process as claimed in claim 2 wherein said alternate pixels are located before said features have been defined.

8. The process as claimed in claim 3 wherein said alternate pixels are located after said features have been defined.

9. The process as claimed in claim 4 wherein said alternate pixels widen said feature.

10. The process as claimed in claim 5 wherein said alternate pixels lengthen said features.

11. A method of defining a pattern on a resist material by electron beam technology, comprising;

forming a desired pattern comprising a main pattern and an enlargement thereof on a grid of a computer aided design machine, said main pattern and enlargement together being larger in one or more directions on said grid by approximately ½ a grid unit, transferring and transposing said main pattern and enlargement on a bit map as data with alternate bits corresponding to the ½ machine unit along the edges of the main pattern thereby defining said enlargement, transferring said bit map data to an electron beam machine, controlling said electron beam of said electron beam machine so as to expose said resist material in said electron beam machine according to the bit map data thereby defining the main pattern with alternate exposed pixels adjacent said main pattern where latter form said enlargement, and developing said resist material to form a main pattern on said resist enlarged by approximately ½ a pixel width.

* * * * *